United States Patent
Haaheim et al.

(10) Patent No.: US 10,680,595 B2
(45) Date of Patent: Jun. 9, 2020

(54) DUTY CYCLE CONVERTER

(71) Applicant: Nordic Semiconductor ASA, Trondheim (NO)

(72) Inventors: Bard Haaheim, Trondheim (NO); Ola Bruset, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/486,460

(22) PCT Filed: Feb. 15, 2018

(86) PCT No.: PCT/GB2018/050406
§ 371 (c)(1),
(2) Date: Aug. 15, 2019

(87) PCT Pub. No.: WO2018/150184
PCT Pub. Date: Aug. 23, 2018

(65) Prior Publication Data
US 2020/0014377 A1    Jan. 9, 2020

(30) Foreign Application Priority Data
Feb. 16, 2017  (GB) .................. 1702513.1

(51) Int. Cl.
*H03K 5/15* (2006.01)
*H03K 7/08* (2006.01)
*H03K 5/04* (2006.01)

(52) U.S. Cl.
CPC ............. *H03K 7/08* (2013.01); *H03K 5/04* (2013.01); *H03K 5/15013* (2013.01)

(58) Field of Classification Search
CPC .. H03K 7/08; H03K 5/04; H03K 5/05; H03K 5/15013; H03K 5/15; H03K 5/1502; H03K 5/1506; H03K 3/017
(Continued)

(56) References Cited

U.S. PATENT DOCUMENTS

| 4,420,696 A | 12/1983 | Gemma et al. |
| 2014/0125390 A1 | 5/2014 | Ma |

(Continued)

FOREIGN PATENT DOCUMENTS

| EP | 0076129 A2 | 4/1983 |
| GB | 2500754 A | 10/2013 |
| WO | WO 2009/144642 | 12/2009 |

OTHER PUBLICATIONS

International Search Report and Written Opinion for PCT/GB2018/050406, dated Jul. 27, 2018, 20 pages.
(Continued)

*Primary Examiner* — Tomi Skibinski
(74) *Attorney, Agent, or Firm* — Klarquist Sparkman, LLP

(57) ABSTRACT

A duty cycle conversion circuit portion comprises N inverters, wherein N is an integer greater than two. The duty cycle conversion circuit is arranged to receive N input signals each having a duty cycle between 1/N and 2/N. Each of the N input signals is applied to a respective input terminal of one of the N inverters such that each inverter receives a different input signal. Each of the N input signals is applied to a respective power terminal of one of the N inverters such that each inverter is powered by a different input signal. Each inverter receives different input signal at its respective input terminal to the input signal applied to its respective power terminal.

12 Claims, 3 Drawing Sheets

(58) Field of Classification Search
USPC ......... 327/291–293, 295–297, 170, 172–176
See application file for complete search history.

(56) References Cited

U.S. PATENT DOCUMENTS

2016/0344378 A1     11/2016  Saito
2018/0102772 A1*     4/2018  Paul ..................... H03K 5/1565

OTHER PUBLICATIONS

Search Report under Section 17(5) for GB1702513.1, dated Aug. 9, 2017, 4 pages.

* cited by examiner

DUTY CYCLE CONVERTER

CROSS REFERENCE TO RELATED APPLICATIONS

This is the U.S. National Stage of International Application No. PCT/GB2018/050406, filed Feb. 15, 2018, which was published in English under PCT Article 21(2), which in turn claims the benefit of Great Britain Application No. 1702513.1, filed Feb. 16, 2017.

The present invention relates to duty cycle converters, particularly converters that generate an output signal having a duty cycle that is dependent on the rising or falling edges of an input signal.

Many modern electronic systems utilise control signals at more than one phase and are known as "multi-phased" systems. An exemplary multi-phased system may be a radio system that employs quadrature modulation and/or demodulation. Such a radio system will typically require in-phase (I) and quadrature(Q) signals for I and Q mixing so as to be able to perform the modulation and/or demodulation as appropriate. If input to differential mixers, these I and Q signals are typically "differential", i.e. the signals are be "two-wire" signals wherein the relative phases of the two I "wires" are 0° and 180° and the relative phases of the two Q wires are 90° and 270°. This radio system is thus a four-phase system. It will of course be appreciated that this is merely one possible application and that there are many examples of such multi-phased systems.

Such multi-phased systems typically employ a number of (usually identical) periodic rectangular pulse waves that have a phase offset between them. Each pulse wave has an associated "duty cycle", i.e. the proportion of time in each given period that the wave is at its "logic high" i.e. a digital "1", as opposed to a digital "0" or "logic low". These multi-phase signals may be arranged such that if there are N signals, each one has a duty cycle of 1/N and their respective logic high periods are non-overlapping. Thus in the four-phase radio system example given above, each of the signals has a 25% duty cycle.

The generation of such multi-phase signals having accurate duty cycles is a common obstacle that engineers face when designing such multi-phased systems. One solution known in the art per se involves utilising a series of Boolean NAND gates to produce an output signal that is set with one type of edge (e.g. a rising edge) of the input signal and is reset with the other type of edge (e.g. a falling edge). However, this imposes stringent duty cycle requirements on the input signal and merely creates a new problem for the designer. It also has a relatively high power requirement when used in a radio frequency (RF) section as it requires a number of gates operating at the high RF frequencies.

When viewed from a first aspect the present invention provides a duty cycle conversion circuit portion comprising N inverters, wherein N is an integer greater than two, said duty cycle conversion circuit being arranged to receive N input signals each having a duty cycle between 1/N and 2/N, wherein:
each of the N input signals is applied to a respective input terminal of one of the N inverters such that each inverter receives a different input signal; and
each of the N input signals is applied to a respective power terminal of one of the N inverters such that each inverter is powered by a different input signal;
wherein each inverter receives different input signal at its respective input terminal to the input signal applied to its respective power terminal.

Thus it will be appreciated by those skilled in the art that the present invention provides a duty cycle conversion circuit portion that requires only one type of edge on the input, either rising or falling, in order to generate an output signal having a controlled duty cycle of 1/N. As the input signals each have a duty cycle greater than 1/N, they can be used to power one of the inverters used to receive the next input signal to transition. In this arrangement, even if only the rising (or falling) edges of the input signals that are used to trigger the transitions in the output are well defined, the output terminals of each of the inverters may produce an output signal having an accurate duty cycle of 1/N. Of course, depending on the required application an duty cycle of 1-1/N can be achieved, for example by rearranging the inputs to the inverters compared to that needed for the 1/N case or by keeping the input arrangement suited to the 1/N case and inverting the respective outputs. The former option is preferred as it may avoid additional current consumption that would be associated with any additional inverters.

Thus when viewed from a second aspect the present invention provides a duty cycle conversion circuit portion comprising N inverters, wherein N is an integer greater than two, said duty cycle conversion circuit being arranged to receive N input signals each having a duty cycle between 1-2/N and 1-1/N, wherein:
each of the N input signals is applied to a respective input terminal of one of the N inverters such that each inverter receives a different input signal; and
each of the N input signals is applied to a respective power terminal of one of the N inverters such that each inverter is powered by a different input signal;
wherein each inverter receives different input signal at its respective input terminal to the input signal applied to its respective power terminal.

A duty cycle conversion circuit portion in accordance with embodiments of the present invention may require fewer nodes compared to conventional solutions, reducing the complexity of the circuit, reducing the bill of materials and cost of the circuit, and reducing the current consumption of the circuit, particularly when operating at RF which typically means it has a relatively high current consumption.

While a single output may be taken from one of the inverters within the duty cycle conversion circuit, in a set of embodiments of either of the foregoing aspects of the invention the duty cycle conversion circuit comprises a plurality of outputs, wherein each output is provided by an output terminal of a different inverter.

In a set of embodiments of either of the foregoing aspects, the input signals are provided by a divider circuit portion—e.g., a divide-by-N circuit portion. Such a divider may be driven by a voltage-controlled oscillator—e.g. to form part of a phase-locked loop.

In some embodiments of the first aspect of the invention, the recited power terminal of each of the N inverters is the positive power terminal and the negative power terminals of the inverters are connected to ground. This allows the duty cycle conversion circuit portion to be triggered by the rising edges (positive transitions) of the input signals.

However, in a set of embodiments of the second aspect of the invention, the recited power terminal of each of the N inverters is the negative power terminal and the positive power terminals of the inverters are connected to the positive supply rail. This allows the duty cycle conversion circuit portion to be triggered by the falling edges (negative transitions) of the input signals.

In a set of embodiments of either of the foregoing aspects, the output signals are used to drive a respective plurality of amplifier circuit portions sharing a common low noise amplifier (LNA). This may prevent short-circuiting of the LNA. Many other applications are also envisaged however.

Certain embodiments of the invention will now be described, by way of example only, with reference to the accompanying drawings in which.

Figure 1:
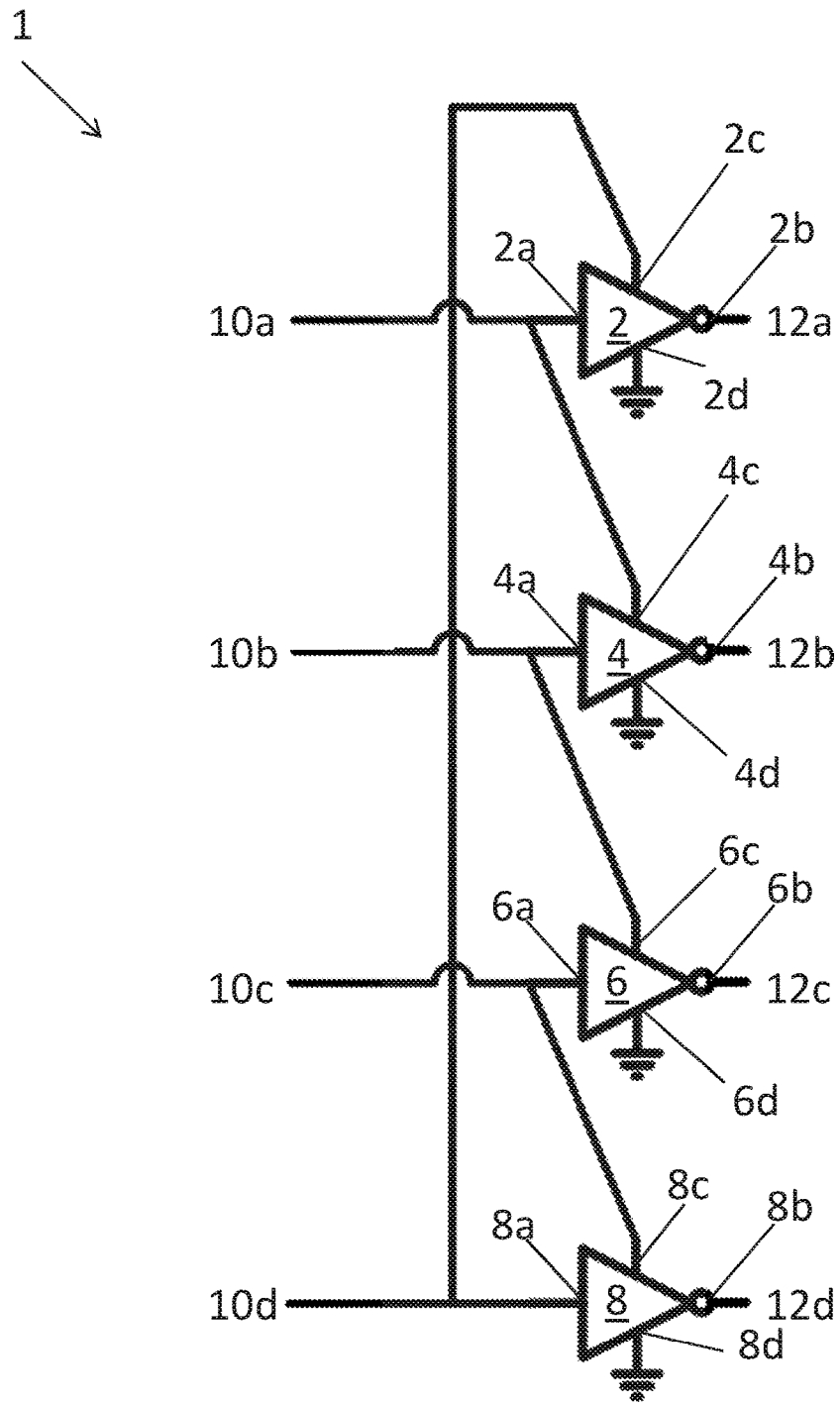
FIG. 1 is a circuit diagram of a duty cycle conversion circuit in accordance with an embodiment of the present invention.

FIG. 1 is a circuit diagram of a duty cycle conversion circuit 1 in accordance with an embodiment of the present invention. The duty cycle conversion circuit 1 comprises 4 Boolean inverters 2, 4, 6, 8. Each inverter 2, 4, 6, 8 respectively comprises: an input terminal to 2a, 4a, 6a, 8a; an output terminal 2b, 4b, 6b, 8b; a positive power terminal 2c, 4c, 6c, 8c; and a negative power terminal 2d, 4d, 6d, 8d.

Each inverter 2, 4, 6, 8 is arranged to receive a different input signal 10a, 10b, 10c, 10d at its respective input terminal 2a, 4a, 6a, 8a and produce an output signal 12a, 12b, 12c, 12d at its respective output terminal 2b, 4b, 6b, 8b, wherein the output signals 12a-d are the logical negation of the respective input signals 10a-d so long as the corresponding inverter 2, 4, 6, 8 is powered on.

While the negative power terminal 2d, 4d, 6d, 8d of each inverter 2, 4, 6, 8 is connected to ground, the positive power terminal 2c, 4c, 6c, 8c of each inverter 2, 4, 6, 8 is connected to the input signal 10a-d applied to a different inverter 2, 4, 6, 8. In this particular arrangement the positive power terminal 2c of the first inverter 2 is connected to the input signal 10d applied to the input terminal 8a of the fourth inverter 8; the positive power terminal 4c of the second inverter 4 is connected to the input signal 10a applied to the input terminal 2a of the first inverter 2; the positive power terminal 6c of the third inverter 6 is connected to the second input signal 10b applied to the input terminal 4a of the second inverter 4; and the positive power terminal 8c of the fourth inverter 8 is connected to the third input signal 10c applied to the input terminal 6a of the third inverter 6. Thus it will be seen that the inverters 2, 4, 6, 8 are arranged in a loop wherein the input signal 10a-d applied to each inverter 2, 4, 6, 8 is used to power the next inverter 2, 4, 6, 8 in the loop.

Figure 2:
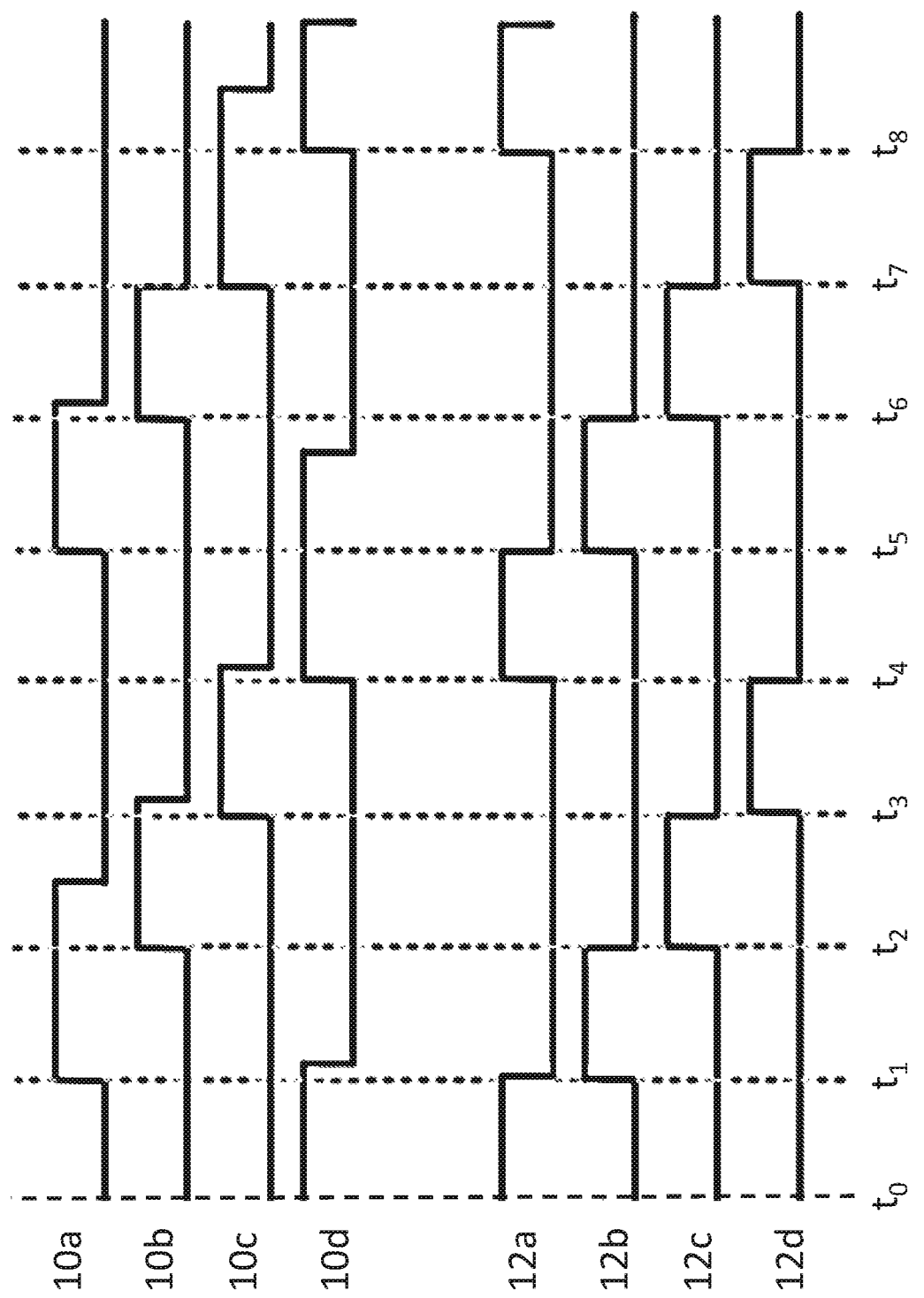
FIG. 2 is a timing diagram illustrating signal transitions typical of the duty cycle conversion circuit shown in FIG. 1.

FIG. 2 is a timing diagram illustrating signal transitions typical of the duty cycle conversion circuit 1 shown in FIG. 1. The input signals 10a-d have a duty cycle between 25% and 50% as required and may, by way of example only, be derived from a divide-by-four divider driven by a voltage controlled oscillator (not shown). In order to conserve power, these signals have a well-defined rising edge but the falling edge is less well-defined. This means that whilst each has a duty cycle of approximately 50%, this is not accurate. Such signals cannot be used directly where a four-phase clock with 25% duty cycle is required—e.g. in a radio receiver that requires I and Q signals for modulation and/or demodulation as described with reference to FIG. 3 below.

At an initial time $t_0$ the input signals 10a-c applied to three of the inverters 2, 4, 6 are at logic low while the other input signal 10d applied to the fourth inverter 8 is logic high. As the fourth input signal 10d is used to power the first inverter 2 by virtue of its connection to its respective input terminal 2c, the first inverter 2 is powered on and thus performs a logical negation of the first input signal 10a and thus produces a logic high at the output terminal 2d as shown by the trace of the output signal 12a. The other three inverters 4, 6, 8 are all powered off at this time.

At time $t_1$ the first input signal 10a undergoes a positive transition to logic high. As the first inverter 2 is still powered on, this changes the first output signal 12a to logic low. However as the first input signal 10a is used to power the second inverter 4 by virtue of its connection to its respective positive power terminal 4c, this powers on the second inverter 4 which performs a logical negation of the second input signal 10b (which is still low) thus driving the second output signal 12b to logic high. Shortly after $t_1$ (but not at a well-defined time) the fourth input signal 10d may happen to undergo a negative transition to logic low which causes the first converter 2 to be powered off. However, this has no effect on the first output signal 12a since it is already at logic low.

At a later time $t_2$ the second input signal 10b undergoes its positive transition to logic high which causes the output signal 12b produced by the second inverter 4 to undergo a negative transition to logic low. The connection between the second input signal 10b and the positive power terminal 6c of the third inverter 6 causes the third inverter 6 to become powered on at this time. As a result of the powering on of the third inverter 6, the third output signal 12c produced by this inverter 6 undergoes a positive transition to logic high as the third input signal 10c is still logic low at this time. Some time thereafter (again not well-defined) the first input signal 10a undergoes a negative transition to logic low, disabling the second inverter 4, whose output has already gone low.

Subsequently at time $t_3$ the third input signal 10c undergoes its positive transition to logic high. As the second input signal 10b is still logic high and accordingly the third inverter 6 is powered on, this causes the output signal 12c produced by the third inverter 6 to undergo a negative transition to logic low at this time. Furthermore since the third input signal 10c is used to power the fourth inverter 8 and the fourth input signal 10d is logic low at this time, the fourth inverter 8 performs a logical negation of the fourth input signal 10d and thus produces a logic high output signal 12d.

At time $t_4$ the fourth input signal 10d undergoes its next positive transition to logic high which causes the fourth output signal 12d (of the still-powered fourth inverter 8) to undergo a negative transition to logic low and the first output signal 12a to undergo a positive transition to logic high because the first inverter 2 is powered once more. The cycle then repeats with time $t_5$ being equivalent to $t_1$, $t_6$ being equivalent to $t_2$ etc.

It can be seen that so long as the rising edges of each of the input signals 10a-d are well defined at the correct intervals and that each input signal 10a-d has a duty cycle between 25% and 50% (i.e. between 1/N and 2/N wherein N=4), each of the output signals 12a-d will have a duty cycle of exactly 25% triggered by only the rising edges of the input signal.

Figure 3:
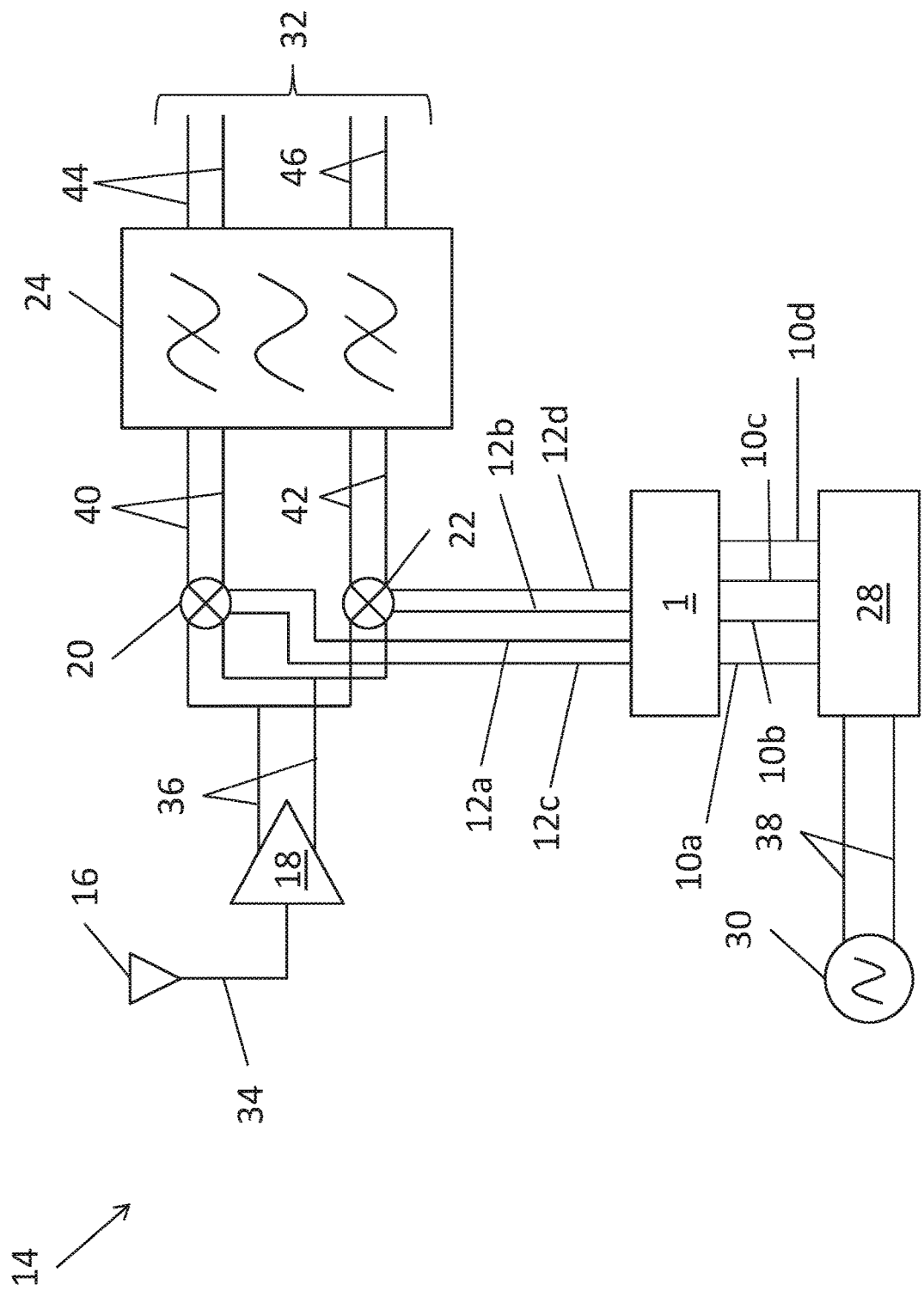
FIG. 3 is a schematic diagram of a radio receiver arranged to perform quadrature demodulation that uses the duty cycle conversion circuit of FIG. 1.

FIG. 3 is a schematic diagram of a radio receiver 14 arranged to perform quadrature demodulation that uses the duty cycle conversion circuit 1 of FIG. 1. As well as the duty cycle conversion circuit 1 described previously, the radio receiver 14 comprises: an antenna 16; a low-noise amplifier (LNA) 18; two differential mixers 20, 22; a bandpass filter 24; a divide-by-two frequency divider 28; and a voltage controlled oscillator (VCO) 30. It will be appreciated that while this radio receiver 14 is an exemplary application of the duty cycle conversion circuit 1 described previously, the duty cycle conversion circuit 1 of FIG. 1 may provide advantages when used in other applications.

Radio signals 34 received at the antenna 16 of the receiver 14 are received at the "over-the-air" frequency $f_{RF}$ and are input to the LNA 18 which amplifies the received signals and produces a "balanced", amplified output signal 36 which is input to each of the mixers 20, 22.

The VCO 30 produces an oscillator signal 38 at an oscillator frequency $f_{VCO}$ which can be controlled in a manner known in the art per se. This oscillator signal 38 is input to the divide-by-two frequency divider 28 which produces the four-phase signals 10a-d described previously at a local oscillator frequency $f_{LO}$ where $f_{LO}$ is half of $f_{VCO}$ (as the oscillator signal 38 is already differential, a divide-by-two frequency divider is used instead of a divide-by-four divider as described previously with reference to FIG. 1). However, each of the four-phase signals 10a-d produced by the divide-by-two divider 28 and described previously with reference to FIG. 2 have arbitrary duty cycles within the 1/N to 2/N range.

The duty cycle conversion circuit 1 converts the four-phase signals 10a-d with arbitrary duty cycles (within the 1/N to 2/N range) to output signals 12a-d, each with a duty cycle of exactly 25% (i.e. exactly 1/N) as described above with reference to FIGS. 1 and 2. These signals 12a-d are input to the mixers 20 and 22 which produce an in-phase (I) signal 40 and a quadrature (Q) signal 42 respectively at an intermediate frequency $f_{IF}$. These I and Q signals 40, 42 are input to the bandpass filter 24 which produces the quadrature (I and Q) output 32 at the intermediate frequency $f_{IF}$, this output 32 comprising a filtered I signal 44 and a filtered Q signal 46 produced by the bandpass filter 24.

Thus it will be seen that the described embodiment of the present invention provides a duty cycle conversion circuit that enables accurate control of a multi-phased system by utilising the power terminals of a number of inverters as control signals so as to allow the definition of the output duty cycle using only one type of input signal edge. This minimises noise and reduces power consumption compared to use of logic gates such as NAND or AND gates to achieve an equivalent effect, without imposing stringent duty cycle requirements in the RF clock generation.

It will be appreciated by those skilled in the art that the embodiments described above are merely exemplary and are not limiting on the scope of the invention.

The invention claimed is:

1. A duty cycle conversion circuit portion comprising N inverters, wherein N is an integer greater than two, said duty cycle conversion circuit being arranged to receive N input signals each having a duty cycle between 1/N and 2/N, wherein:
   each of the N input signals is applied to a respective input terminal of one of the N inverters such that each inverter receives a different input signal; and
   each of the N input signals is applied to a respective power terminal of one of the N inverters such that each inverter is powered by a different input signal;
   wherein each inverter receives different input signal at its respective input terminal to the input signal applied to its respective power terminal.

2. The duty cycle conversion circuit portion as claimed in claim 1, comprising a plurality of outputs, wherein each output is provided by an output terminal of a different inverter.

3. The duty cycle conversion circuit portion as claimed in claim 1, wherein the input signals are provided by a divider circuit portion.

4. The duty cycle conversion circuit portion as claimed in claim 3, wherein the divider circuit portion comprises a divide-by-N circuit portion.

5. The duty cycle conversion circuit portion as claimed in claim 1, wherein the power terminal of each of the N inverters is a positive power terminal and a negative power terminal of each of the inverters is connected to ground.

6. The duty cycle conversion circuit portion as claimed in claim 1, wherein the output signals are used to drive a respective plurality of amplifier circuit portions sharing a common low noise amplifier.

7. A duty cycle conversion circuit portion comprising N inverters, wherein N is an integer greater than two, said duty cycle conversion circuit being arranged to receive N input signals each having a duty cycle between 1-1/N and 1-2/N, wherein:
   each of the N input signals is applied to a respective input terminal of one of the N inverters such that each inverter receives a different input signal; and
   each of the N input signals is applied to a respective power terminal of one of the N inverters such that each inverter is powered by a different input signal;
   wherein each inverter receives different input signal at its respective input terminal to the input signal applied to its respective power terminal.

8. The duty cycle conversion circuit portion as claimed in claim 7, comprising a plurality of outputs, wherein each output is provided by an output terminal of a different inverter.

9. The duty cycle conversion circuit portion as claimed in claim 7, wherein the input signals are provided by a divider circuit portion.

10. The duty cycle conversion circuit portion as claimed in claim 9, wherein the divider circuit portion comprises a divide-by-N circuit portion.

11. The duty cycle conversion circuit portion as claimed in any claim 7, wherein the power terminal of each of the N inverters is a negative power terminal and a positive power terminal of each of the inverters is connected to ground.

12. The duty cycle conversion circuit portion as claimed in any claim 7, wherein the output signals are used to drive a respective plurality of amplifier circuit portions sharing a common low noise amplifier.

* * * * *